United States Patent
Arita et al.

(10) Patent No.: US 6,921,720 B2
(45) Date of Patent: Jul. 26, 2005

(54) PLASMA TREATING APPARATUS AND PLASMA TREATING METHOD

(75) Inventors: Kiyoshi Arita, Fukuoka (JP); Tetsuhiro Iwai, Kasuga (JP); Junichi Terayama, Tosu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 263 days.

(21) Appl. No.: 10/227,930

(22) Filed: Aug. 26, 2002

(65) Prior Publication Data

US 2003/0037882 A1 Feb. 27, 2003

(30) Foreign Application Priority Data

Aug. 27, 2001 (JP) .................................... P.2001-255700

(51) Int. Cl.[7] ........................................... H01L 21/302
(52) U.S. Cl. ....................... 438/706; 156/345; 118/500
(58) Field of Search ................................ 438/706, 710, 438/714, 715, 716, 729, 731; 156/345; 118/500

(56) References Cited

U.S. PATENT DOCUMENTS

| | | | |
|---|---|---|---|
| 5,693,182 A | | 12/1997 | Mathuni |
| 5,837,599 A | * | 11/1998 | Tao et al. .................... 438/584 |
| 5,851,641 A | | 12/1998 | Matsunaga et al. |
| 6,239,036 B1 | | 5/2001 | Arita et al. |
| 6,273,023 B1 | * | 8/2001 | Tsuchihashi et al. ..... 118/723 E |
| 6,488,863 B2 | * | 12/2002 | Yatsuda et al. ................ 216/72 |
| 6,492,612 B1 | * | 12/2002 | Taguchi et al. ......... 219/121.43 |
| 6,558,508 B1 | * | 5/2003 | Kawakami ............. 156/345.51 |
| 6,733,624 B2 | * | 5/2004 | Koshiishi et al. ........... 118/500 |

FOREIGN PATENT DOCUMENTS

| | | |
|---|---|---|
| JP | 2-270320 | 11/1990 |
| JP | 4-62921 | 2/1992 |

OTHER PUBLICATIONS

Patent Abstracts of Japan, vol. 017, No. 672 (E–1474), Dec. 10, 1993 and JP 05–226468, Sep. 3, 1993, abstract.
Patent Abstracts of Japan, vol. 018, No. 684 (E–1650), Dec. 22, 1994 and JP 06–275708, Sep. 30, 1994, abstract.

\* cited by examiner

*Primary Examiner*—Kin-Chan Chen
(74) *Attorney, Agent, or Firm*—Pearne & Gordon LLP

(57) ABSTRACT

In a plasma treating apparatus for carrying out a plasma treatment over a silicon wafer 6 having a protective tape 6a stuck to a circuit formation face, the silicon wafer 6 is mounted on a mounting surface 3d which is provided on an upper surface of a lower electrode 3 formed of a conductive metal with the protective tape 6a turned toward the mounting surface 3d. When a DC voltage is to be applied to the lower electrode 3 by a DC power portion 18 for electrostatic adsorption to adsorb and hold the silicon wafer 6 onto the lower electrode 3 in the plasma treatment, the protective tape 6a is utilized as a dielectric for the electrostatic adsorption. Consequently, the dielectric can be thinned as much as possible and the silicon wafer 6 can be held by a sufficient electrostatic holding force.

9 Claims, 8 Drawing Sheets

PLASMA TREATING APPARATUS AND PLASMA TREATING METHOD

BACKGROUND OF THE INVENTION

The present invention relates to a plasma treating apparatus and a plasma treating method in which a plasma treatment is carried out over a semiconductor substrate such as a silicon wafer.

In a process for manufacturing a silicon wafer to be used in a semiconductor device, a thinning work for reducing the thickness of a substrate is carried out with a reduction in the thickness of the semiconductor device. The thinning work is carried out by forming a circuit pattern on the surface of a silicon substrate, and then, mechanically polishing the back of a circuit formation face. A plasma treatment is carried out in order to remove, by etching, a damage layer generated on the polished surface of the silicon substrate by the mechanical polishing after the polishing work.

In the plasma treatment, the silicon wafer is to be held in such an attitude that a surface to be treated (a back face) is turned upward. For this reason, the silicon wafer is held in such an attitude that the circuit formation face side is turned toward the mounting surface of a substrate mounting portion. At this time, a protective tape is stuck on to the circuit formation face in order to prevent a circuit from being damaged due to a direct contact with the mounting surface.

As a method of holding the silicon wafer, there has been known a method using electrostatic adsorption. In this method, the silicon wafer is mounted on a substrate mounting portion in which the surface of a conductor is coated with a thin insulating layer, a DC voltage is applied to the conductor to cause the surface of the substrate mounting portion to be an electrostatic adsorption surface, and a coulomb force is applied between the silicon wafer and the conductor provided under the insulating layer, thereby holding the silicon wafer in the substrate mounting portion.

In the case in which the silicon wafer having the protective tape stuck thereto is held by the electrostatic adsorption, however, the coulomb force acts with an insulating protective tape provided in addition to the insulating layer. As compared with the case in which the silicon wafer is directly bonded hermetically to the electrostatic adsorption surface without the protective tape, therefore, the electrostatic adsorption force is small and a sufficient holding force cannot be obtained in some cases. Also in the case in which a resin layer is formed for sealing or wiring over the surface of the silicon wafer and the resin layer side is hermetically bonded to the electrostatic adsorption surface to carry out the electrostatic adsorption, furthermore, the same problem arises.

SUMMARY OF THE INVENTION

Therefore, it is an object of the invention to provide a plasma treating apparatus and a plasma treating method which can hold a semiconductor substrate by a sufficient electrostatic holding force to eliminate a drawback.

In a plasma treating apparatus for carrying out a plasma treatment over a silicon wafer having a protective tape stuck to a circuit formation face, the silicon wafer is mounted on a mounting surface which is provided on an upper surface of a lower electrode formed of a conductive metal with the protective tape turned toward the mounting surface. When a DC voltage is to be applied to the lower electrode by a DC power portion for electrostatic adsorption to adsorb and hold the silicon wafer onto the lower electrode in the plasma treatment, the protective tape is utilized as a dielectric for the electrostatic adsorption. Consequently, the dielectric can be thinned as much as possible and the silicon wafer can be held by a sufficient electrostatic holding force.

DETAILED DESCRIPTION OF THE PREFERRED EMBODIMENTS

Figure 1:
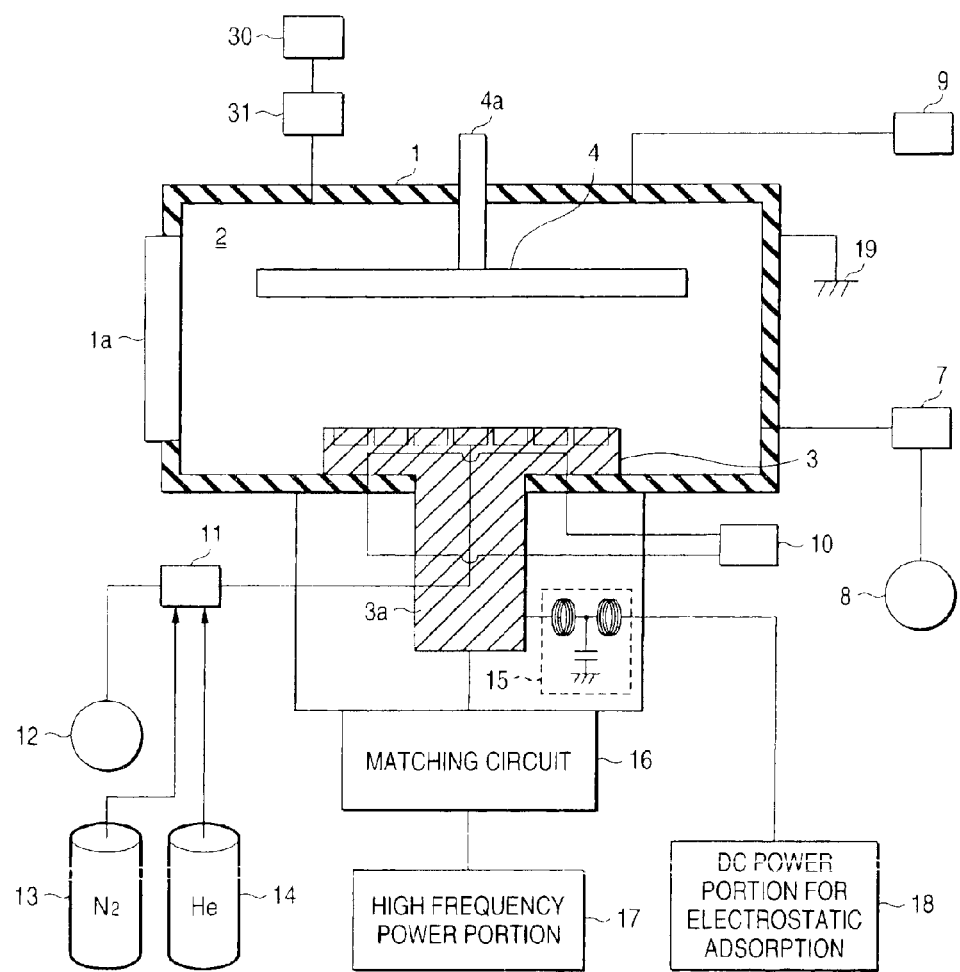
FIG. 1 is a sectional view showing a plasma treating apparatus according to an embodiment of the invention.
Figure 2:
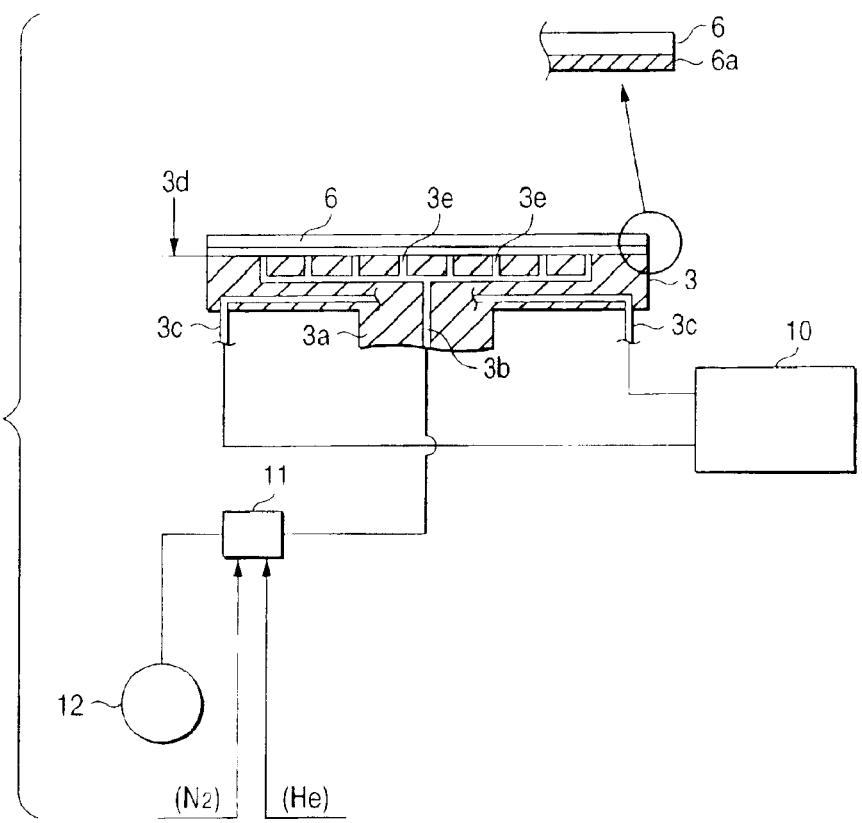
FIG. 2 is a sectional view showing the substrate mounting portion of the plasma treating apparatus according to the embodiment of the invention.
Figure 3:
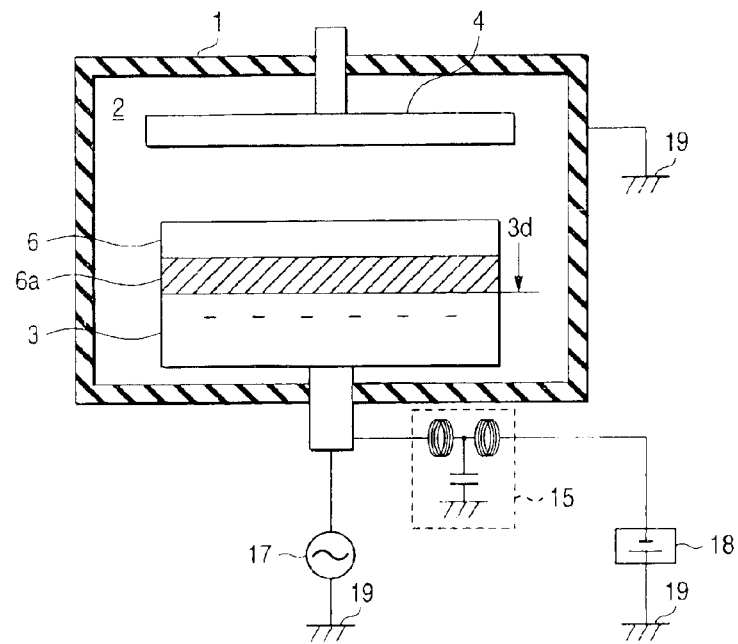
FIG. 3 is a sectional view showing the plasma treating apparatus according to the embodiment of the invention.
Figure 3:
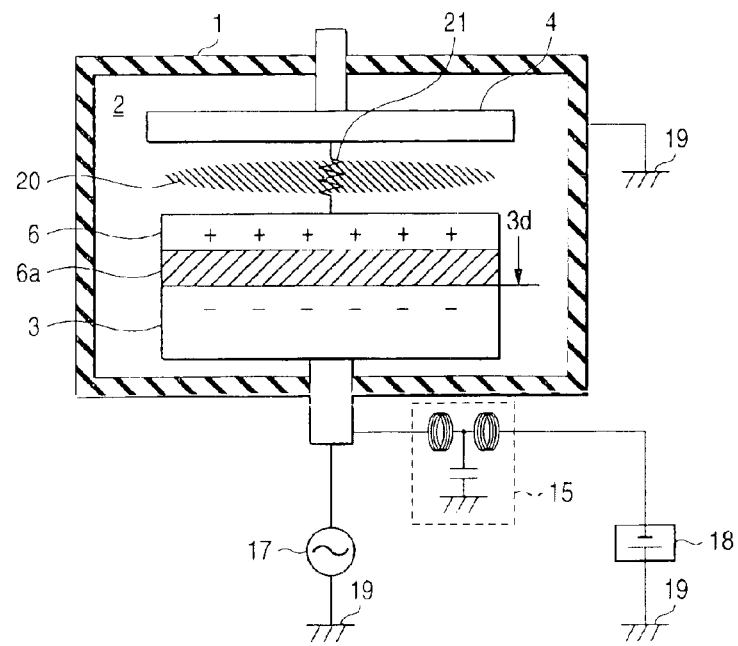
Figure 4:
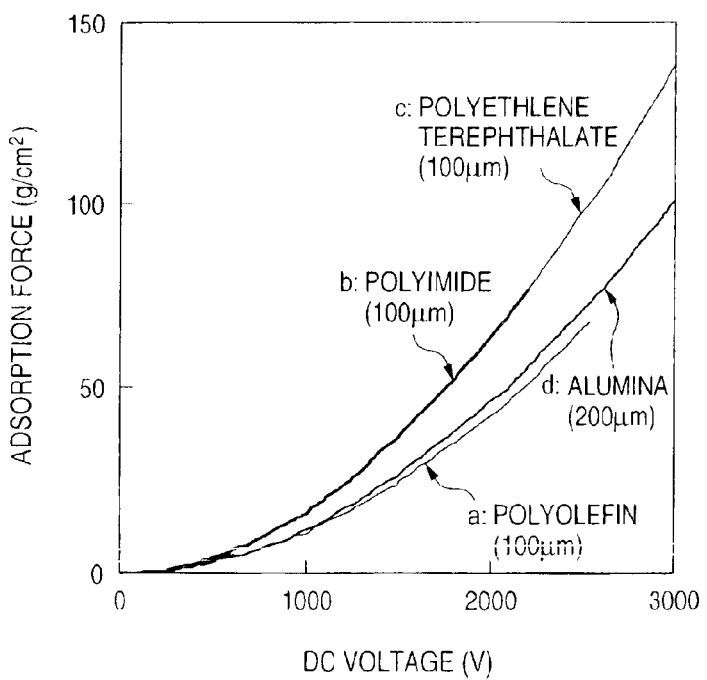
FIG. 4 is a graph showing an electrostatic adsorption force in the plasma treating apparatus according to the embodiment of the invention.
Figure 5:
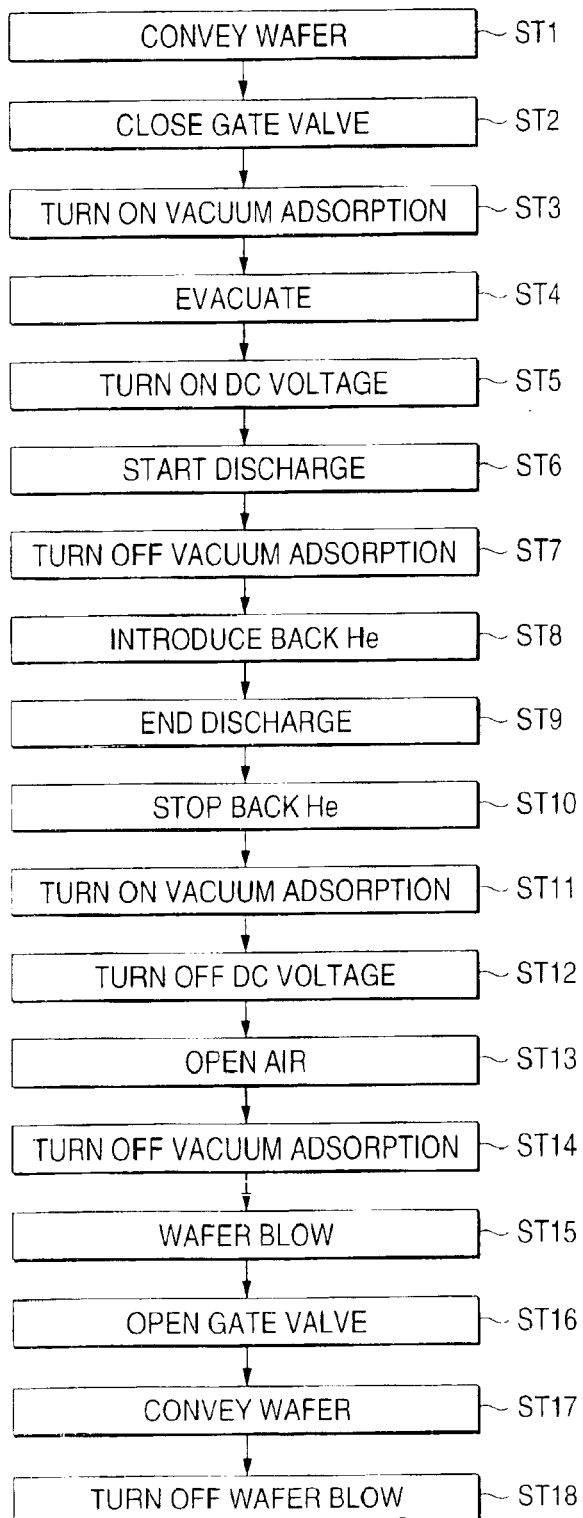
FIG. 5 is a flow chart showing a plasma treating method according to an embodiment of the invention.
Figure 6:
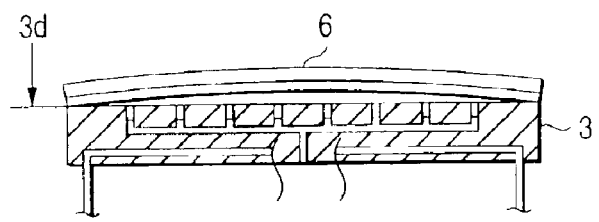
FIG. 6 is a view illustrating a process for the plasma treating method according to the embodiment of the invention.
Figure 6:
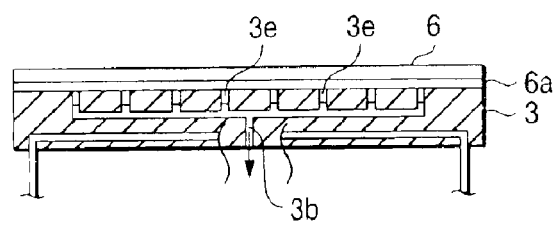
Figure 6:
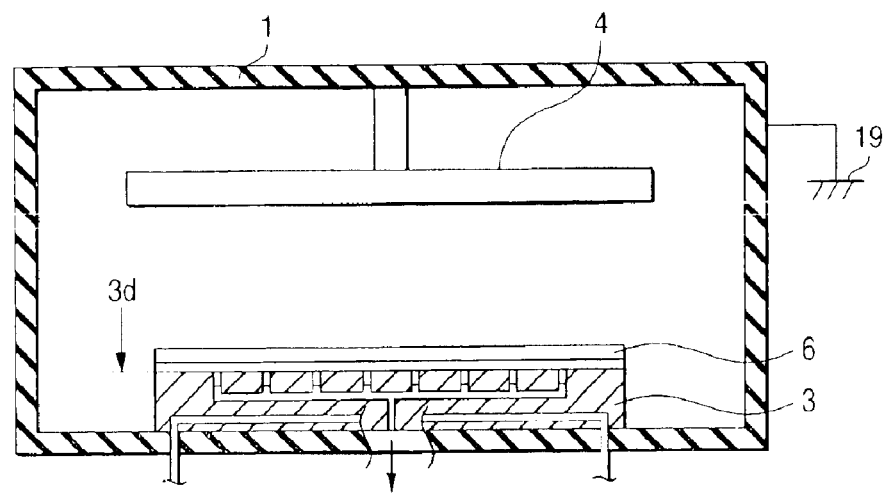
Figure 7:
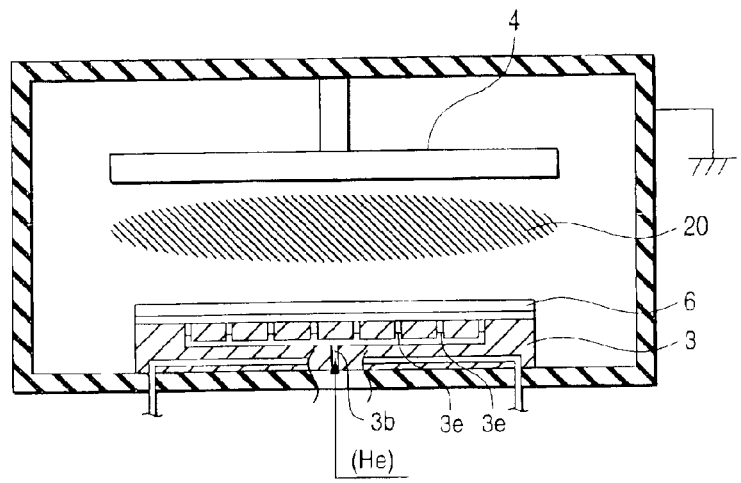
FIG. 7 is a view illustrating the plasma treating method according to the embodiment of the invention.
Figure 7:
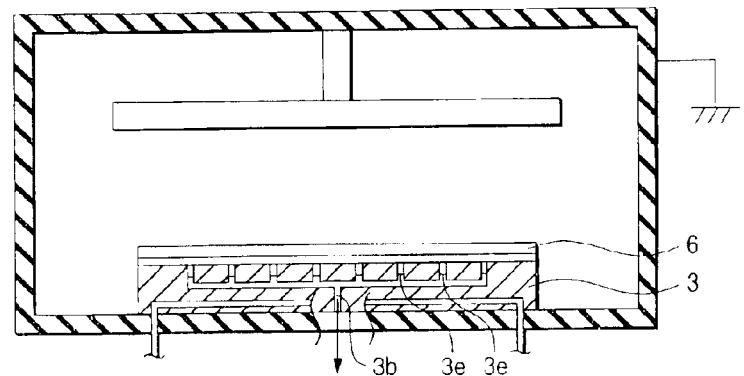
Figure 7:
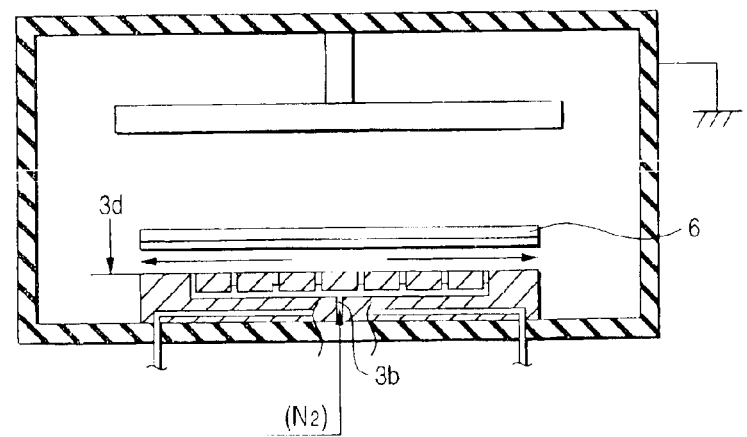
Figure 8:
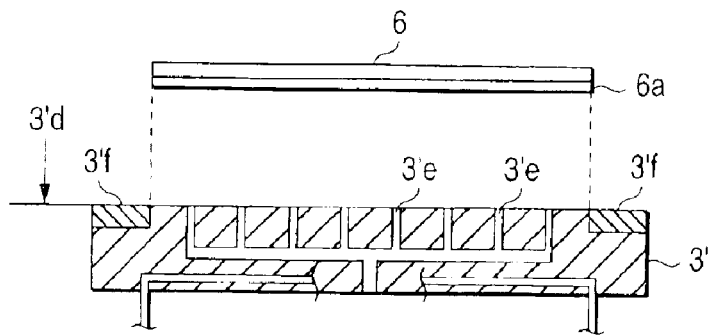
FIG. 8 is a view showing the substrate mounting portion of the plasma treating apparatus according to the embodiment of the invention.
Figure 8:
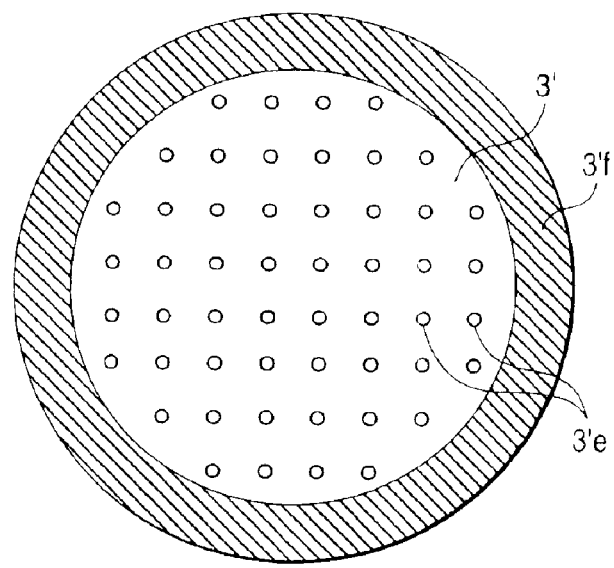
Figure 8:
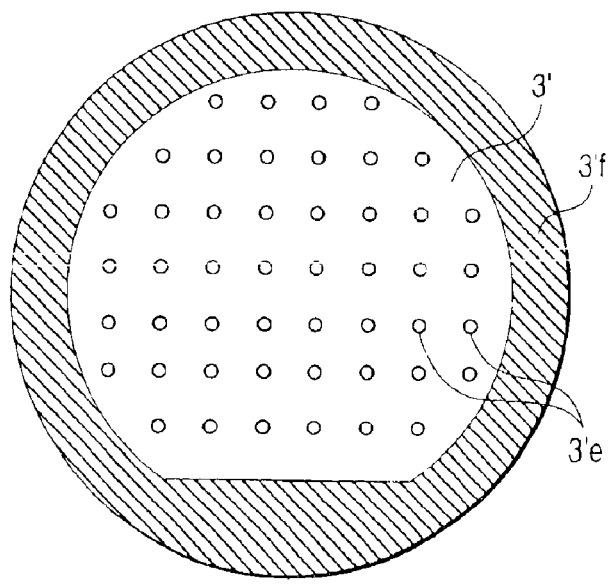

Next, an embodiment of the invention will be described with reference to the drawings. FIG. 1 is a sectional view showing a plasma treating apparatus according to an embodiment of the invention, FIG. 2 is a sectional view showing the substrate mounting portion of the plasma treating apparatus according to the embodiment of the invention, FIG. 3 is a sectional view showing the plasma treating apparatus according to the embodiment of the invention, FIG. 4 is a graph showing an electrostatic adsorption force in the plasma treating apparatus according to the embodiment of the invention, FIG. 5 is a flow chart showing a plasma treating method according to an embodiment of the invention, FIGS. 6 and 7 are views illustrating a process for the plasma treating method according to the embodiment of the invention, and FIG. 8 is a view showing the substrate mounting portion of the plasma treating apparatus according to the embodiment of the invention.

First of all, the plasma treating apparatus will be described with reference to FIGS. 1 and 2. In FIG. 1, the inside of a vacuum chamber 1 acts as a treatment chamber 2 for carrying out a plasma treatment, and a lower electrode 3 and an upper electrode 4 are vertically opposed to each other in the treatment chamber 2. The lower electrode 3 is attached to the vacuum chamber 1 in an electrical insulation state through a support portion 3a extended downward, and furthermore, the upper electrode 4 is attached to the vacuum chamber 1 in a conduction state through a support portion 4a extended upward.

The lower electrode 3 is fabricated by a conductive metal, and the upper surface of the lower electrode 3 has almost the same shape as the planar shape of a silicon wafer 6 (FIG. 2) which is a semiconductor substrate to be treated and acts as a mounting surface 3d for mounting the semiconductor substrate thereon. Accordingly, the lower electrode 3 acts as a substrate mounting portion provided with a mounting surface to which a conductor is exposed and serving to mount the semiconductor substrate thereon. The silicon wafer 6 is set in a state obtained immediately after the back side of a circuit formation face is polished by mechanical polishing, and a protective tape 6a is stuck to the circuit formation face of the silicon wafer 6 in order to protect the circuit formation face from an impact generated during the mechanical polishing as shown in FIG. 2. The silicon wafer 6 is mounted on the mounting surface of the mounting portion in such a state that the protective tape 6a side is turned toward the mounting surface 3d of the lower electrode 3 and the mechanical polished surface is turned upward. In the mounting state, an insulating layer is provided in contact with the mounting surface to be a conductor. The mechanical polished surface is subjected to the plasma treatment so that a damage layer generated by the polishing work is removed.

The protective tape 6a is a resin tape obtained by forming an insulating resin using polyolefin, polyimide or polyethylene terephthalate as a material into a film having a thickness of approximately 100 μm and is stuck to the circuit formation face of the silicon wafer 6 with an adhesive. The protective tape 6a stuck to the silicon wafer 6 is an insulating layer formed on the circuit formation face (surface) and the insulating layer functions as a dielectric in the electrostatic adsorption of the silicon wafer 6 onto the mounting surface as will be described below.

A gate valve 1a for substrate conveyance in/out is provided on the side surface of the vacuum chamber 1. The gate valve 1a is opened and closed by a gate switching mechanism (not shown). An exhaust pump 8 is connected to the vacuum chamber 1 through a valve opening mechanism 7. When the valve opening mechanism 7 is brought into an opening state to drive the exhaust pump 8, the inside of the treatment chamber 2 in the vacuum chamber 1 is evacuated. When an air opening mechanism 9 is brought into an opening state, the air is introduced into the treatment chamber 2 so that a vacuum is broken.

As shown in FIG. 2, a large number of adsorption holes 3e opened to an upper surface are provided on the lower electrode 3 and communicate with a suction hole 3b provided in the lower electrode 3. The suction hole 3b is connected to a vacuum adsorption pump 12 through a gas line change-over switching mechanism 11, and the gas line change-over switching mechanism 11 is connected to an $N_2$ gas feeding portion 13 and a He gas feeding portion 14 as shown in FIG. 1. By switching the gas line change-over switching mechanism 11, the suction hole 3b can be selectively connected to the vacuum adsorption pump 12, the $N_2$ gas feeding portion 13 and the He gas feeding portion 14.

When the vacuum adsorption pump 12 is driven in such a state that the suction hole 3b communicates with the vacuum adsorption pump 12, vacuum suction is carried out through the adsorption hole 3e and the silicon wafer 6 mounted on the mounting surface 3d is subjected to the vacuum adsorption and is thus held. Accordingly, the adsorption hole 3e, the suction hole 3b and the vacuum adsorption pump 12 act as vacuum holding means for carrying out the vacuum suction through the adsorption hole 3e opened to the mounting surface 3d, thereby vacuum adsorbing the plate-shaped substrate to be held on the mounting surface 3d.

Moreover, the suction hole 3b is connected to the $N_2$ gas feeding portion 13 or the He gas feeding portion 14 so that a nitrogen gas or a helium gas can be jetted from the adsorption hole 3e toward the lower surface of the silicon wafer 6. As will be described below, the nitrogen gas is a gas for blow to forcibly remove the silicon wafer 6 from the mounting surface 3d, and the helium gas is a gas for heat transfer which is to be used for promoting the cooling of the silicon wafer during the plasma treatment.

A gas feeding portion 30 for plasma generation which serves to feed a gas for plasma generation is connected to the treatment chamber 2 of the vacuum chamber 1 through a gas feeding control portion 31. The gas feeding control portion 31 is constituted by a switching valve for controlling the supply of the gas for plasma generation to the vacuum chamber 1 and a flow control valve for controlling a flow rate. A gas mainly containing a fluorine based gas is often used as the gas for plasma generation, and it is preferable that a gas mainly containing $SF_6$ (sulfur hexafluoride) should be used for the plasma treatment to remove the damage layer formed by the polishing work.

Moreover, a refrigerant passage 3c for cooling is provided in the lower electrode 3. The refrigerant passage 3c is connected to a cooling mechanism 10. By driving the cooling mechanism 10, a refrigerant such as cooling water is circulated in the refrigerant passage 3c, thereby cooling the lower electrode 3 and the protective tape 6a stuck onto the lower electrode 3 of which temperatures are raised by heat generated during the plasma treatment. The refrigerant passage 3c and the cooling mechanism 10 act as cooling means for cooling the lower electrode 3 to be the substrate mounting portion.

The lower electrode 3 is electrically connected to a high frequency power portion 17 through a matching circuit 16. By driving the high frequency power portion 17, a high frequency voltage is applied between the upper electrode 4 and the lower electrode 3 which are conducted to the vacuum chamber 1 grounded on a grounding portion 19. Consequently, a plasma discharge is generated in the treatment chamber 2. The matching circuit 16 matches the impedances of a plasma discharge circuit for generating a plasma in the treatment chamber 2 and the high frequency power portion 17. The lower electrode 3, the upper electrode 4 and the high frequency power portion 17 act as plasma generating means for generating a plasma to carry out the plasma treatment over the silicon wafer 6 mounted on the mounting surface.

While the example of a method of applying a high frequency voltage between the opposed parallel plate electrodes (the lower electrode 3 and the upper electrode 4) has been illustrated as the plasma generating means, it is also possible to employ another method, for example, a method in which a plasma generating apparatus is provided in the upper part of the treatment chamber 2 to feed a plasma into the treatment chamber 2 through down flow.

Moreover, a DC power portion 18 for electrostatic adsorption is connected to the lower electrode 3 through an RF filter 15. By driving the DC power portion 18 for electrostatic adsorption, a DC voltage is applied to the lower electrode 3 as shown in FIG. 3A so that a negative electric charge is stored on the surface of the lower electrode 3. In this state, then, the high frequency power portion 17 is driven to generate a plasma in the treatment chamber 2 as shown in FIG. 3B (see a dotted portion 20 in the drawing). Consequently, a direct current applying circuit 21 for connecting the silicon wafer 6 mounted on the mounting surface 3d to the grounding portion 19 is formed through the plasma in the treatment chamber 2. Thus, a closed circuit for sequentially connecting the lower electrode 3, the RF filter 15, the DC power portion 18 for electrostatic adsorption, the grounding portion 19, the plasma and the silicon wafer 6 is formed and a positive electric charge is stored in the silicon wafer 6.

A coulomb force acts between the negative electric charge stored in the lower electrode 3 and the positive electric charge stored in the silicon wafer 6. By the coulomb force, the silicon wafer 6 is held in the lower electrode 3 through the protective tape 6a to be a dielectric. At this time, the RF filter 15 prevents the high frequency voltage of the high frequency power portion 17 from being directly applied to the DC power portion 18 for electrostatic adsorption. The lower electrode 3 and the DC power portion 18 for electrostatic adsorption act as electrostatic adsorbing means for holding the silicon wafer 6 to be the plate-shaped substrate on the mounting surface 3d by the electrostatic adsorption. The polarity of the DC power portion 18 for electrostatic adsorption may be reversed to be positive or negative.

With reference to FIG. 4, an electrostatic adsorption force will be described. An adsorption force F obtained by the coulomb force is given by $F=1/2\in(V/d)^2$, wherein $\in$ represents a dielectric constant of a dielectric, V represents a DC voltage to be applied and d represents a thickness of the dielectric. FIG. 4 shows the relationship between an electrostatic adsorption force and a DC voltage to be applied which is obtained in the case in which the protective tape 6a fabricated by a resin is stuck to the silicon wafer 6 and is used as a dielectric in the electrostatic adsorption.

Three kinds of resin materials, for example, polyolefin, polyimide and polyethylene terephthalate are used for the protective tape 6a and calculation examples in which they are fabricated in a thickness of 100 μm are shown in curves a, b and c, respectively. For comparison, the curve d shows an electrostatic adsorption force which is obtained when an alumina insulating layer is formed on a substrate mounting surface in a thickness of 200 μm and is used as a dielectric for the electrostatic adsorption to electrostatically adsorb a silicon wafer having no protective tape.

As shown in FIG. 4, in the example of the polyolefin, the adsorption force is almost equal to that in the case of a conventional alumina insulating layer. In the case in which two kinds of materials, for example, polyimide and polyethylene terephthalate are used, a greater adsorption force than the adsorption force obtained by using the alumina insulating layer is acquired.

More specifically, it is not necessary to form an insulating layer on a lower electrode which is required for carrying out the electrostatic adsorption in the conventional plasma treating apparatus, and furthermore, it is possible to implement an excellent adsorption force. Moreover, the protective tape is caused to directly come in contact with the surface of the lower electrode 3 without an insulating layer such as alumina which has a low thermal conductivity. Consequently, an excellent cooling effect can be obtained and the heat damage of the protective tape 6a and the silicon wafer 6 can be relieved.

The plasma treating apparatus is constituted as described above. A plasma treating method will be described below with reference to FIGS. 6 and 7 in accordance with a flow in FIG. 5. In FIG. 5, first of all, the silicon wafer 6 to be a treating object is conveyed into the treatment chamber 2 (ST1) and is mounted on the mounting surface 3d of the lower electrode 3 (a mounting step). At this time, since the silicon wafer 6 is thin and flexible, a warpage is generated so that the mounting is carried out with a clearance generated between the silicon wafer 6 and the mounting surface 3d in some cases as shown in FIG. 6A. Then, the gate valve 1a is closed (ST2) and the vacuum adsorption pump 12 is driven. As shown in FIG. 6B, consequently, vacuum suction is carried out through the adsorption hole 3e and the suction hole 3b so that the vacuum adsorption state of the silicon wafer 6 is turned ON (ST3). As shown in FIG. 6C, thus, the silicon wafer 6 is held by the vacuum adsorption in a hermetic contact state with the mounting surface 3d (a holding step).

Next, the exhaust pump 8 is driven to evacuate the treatment chamber 2, and the gas feeding control portion 31 is operated to feed a gas for plasma generation into the treatment chamber 2 (ST4). Then, the DC power portion 18 for electrostatic adsorption is driven to turn ON the application of a DC voltage (ST5) and the high frequency power portion 17 is driven to start a plasma discharge (ST6). As shown in FIG. 7(a), consequently, a plasma is generated in a space between the silicon wafer 6 provided on the lower electrode 3 and the lower surface of the upper electrode 4 so that a plasma treatment intended for the silicon wafer 6 is carried out (a plasma treating step). In the plasma treatment, an electrostatic adsorption force is generated between the lower electrode 3 and the silicon wafer 6 (see FIG. 3(b)), and the silicon wafer 6 is held in the lower electrode 3 by the electrostatic adsorption force.

Thereafter, the gas line change-over switching mechanism 11 is driven to turn OFF the vacuum adsorption (ST7) and back He introduction is carried out (ST8). More specifically, the hold of the silicon wafer 6 in the lower electrode 3 by the vacuum suction is released and a helium gas for heat transfer is then fed from the He gas feeding portion 14 through the suction hole 3b and is jetted from the adsorption hole 3e toward the lower surface of the silicon wafer 6 as shown in FIG. 7A. In the plasma treatment, the lower electrode 3 is cooled by the cooling mechanism 10 and the heat of the silicon wafer 6 having a temperature raised by the plasma treatment is transferred to the lower electrode 3 through a helium gas to be a gas having a great heat transfer property. Consequently, the silicon wafer 6 can be cooled efficiently.

If a predetermined plasma treating time is passed and the discharge is completed (ST9), the supply of the back He and the gas for plasma generation is stopped (ST10), and the vacuum adsorption is turned ON again as shown in FIG. 7B (ST11) Consequently, the silicon wafer 6 is held on the mounting surface 3d by the vacuum adsorption force in place of the electrostatic adsorption force eliminated by the completion of the plasma discharge.

Then, the DC power portion 18 for electrostatic adsorption is stopped to turn OFF the DC voltage (ST12), and the air opening mechanism 9 is driven to carry out atmospheric opening in the treatment chamber 2 (ST13).

Thereafter, the gas line change-over switching mechanism 11 is driven again to turn OFF the vacuum adsorption (ST14). Subsequently, wafer blow is carried out (ST15). More specifically, as shown in FIG. 7C, a nitrogen gas is fed through the suction hole 3b and is thus jetted from the adsorption hole 3e. Consequently, the silicon wafer 6 is removed from the mounting surface 3d of the lower electrode 3. Next, when the gate valve 1a is brought into an opening state (ST16) and the silicon wafer 6 is conveyed to the outside of the treatment chamber 2 (ST17), the wafer blow is turned OFF (ST18) and one cycle for the plasma treatment is ended.

As described above, in the plasma treatment according to the embodiment, a plasma is generated in the treatment chamber 2 so that the silicon wafer 6 is held in the lower electrode 6 by the vacuum adsorption before the electrostatic adsorption force is generated. Also in the case in which a thin and flexible plate-shaped substrate such as the silicon wafer 6 is intended, the silicon wafer 6 can be always bonded hermetically to the mounting surface 3*d* of the lower electrode 3 and can be thus held properly. Accordingly, it is possible to prevent an abnormal discharge from being caused in a clearance between the upper surface of the lower electrode 3 and the lower surface of the silicon wafer 6 in the case of a hermetic bonding failure and the silicon wafer 6 from being overheated due to a cooling failure.

In place of the lower electrode 3 in which the whole range of the mounting surface 3*d* is formed of a conductor, a lower electrode 3' shown in FIG. 8 may be used as a lower electrode. In this example, as shown in FIG. 8A, an insulating portion 3'*f* having a predetermined width is formed in an outer edge portion in which a mounting surface 3'*d* is larger than the silicon wafer 6 to be the semiconductor substrate and is protruded from the size of the silicon wafer 6. The insulating portion 3'*f* is formed of ceramic such as alumina and a planar shape thereof is determined depending on the shape of a silicon wafer to be mounted on the mounting surface 3'*d*. FIGS. 8B and 8C show an example of the shape of the insulating portion 3'*f* in each of the case in which there is no oriental flat indicating the direction of the silicon wafer and the case in which there is the oriental flat.

By using such a lower electrode 3', it is possible to obtain an advantage that a conductor provided on the upper surface of the lower electrode 3' is not directly exposed to a plasma with the silicon wafer mounted and a plasma discharge can be generated more uniformly over the mounting surface of the lower electrode 3'.

While the example in which the resin protective tape 6a stuck to the silicon wafer 6 is the dielectric for the electrostatic adsorption as the insulating layer has been described in the embodiment, it is possible to hermetically bond, to the mounting surface, an insulating resin layer formed to seal the circuit formation face of the silicon wafer or an insulating resin layer provided to form another wiring layer on the circuit formation face and to utilize the insulating resin layer as the dielectric for the electrostatic adsorption.

According to the invention, the mounting surface of the substrate mounting portion is caused to be a conductor and the semiconductor substrate is mounted with the insulating layer side turned toward the mounting surface, and the insulating layer of the semiconductor substrate is utilized as the dielectric for the electrostatic adsorption to electrostatically adsorb the semiconductor substrate onto the mounting surface. Consequently, the semiconductor substrate can be held by a sufficient electrostatic holding force.

What is claimed is:

1. A plasma treating method for carrying out a plasma treatment in such a state that a semiconductor substrate having an insulating layer on a surface is held on a mounting surface of a substrate mounting portion by electrostatic adsorption, the method comprising the steps of:

setting at least a part of the mounting surface to be a conductor and causing the conductor to come in contact with the insulating layer with an insulating layer side of the semiconductor substrate turned toward the mounting surface of the substrate mounting portion, thereby carrying out mounting; and generating a plasma with a DC voltage applied to the substrate mounting portion, thereby carrying out the plasma treatment over the semiconductor substrate, wherein the semiconductor substrate is electrostatically adsorbed into the mounting surface by a coulomb force generated between an electric charge stored in the semiconductor substrate and an electric charge stored in the mounting surface by utilizing the insulating layer as a dielectric for the electrostatic adsorption at the step of carrying out the plasma treatment;

wherein the insulating layer is a resin tape stuck to a surface of the semiconductor substrate.

2. The plasma treating method according to claim 1, wherein a material of the resin tape is one of polyolefin, polyimide and polyethylene terephthalate.

3. The plasma treating method according to claim 1, wherein the semiconductor substrate is a silicon wafer having a circuit formation face and the insulating layer is a protective tape for protecting the circuit formation face.

4. The plasma treating method according to claim 3, wherein a material of the protective tape is one of polyolefin, polyimide and polyethylene terephthalate.

5. The plasma treating method according to claim 1, wherein the semiconductor substrate is a silicon wafer having a circuit formation face and the insulating layer is an insulating resin layer formed to seal the circuit formation face.

6. The plasma treating method according to claim 1, wherein the semiconductor substrate is a silicon wafer having a circuit formation face and the insulating layer is an insulating resin layer provided to form a wiring layer on the circuit formation face.

7. The plasma treating method according to claim 1, further comprising vacuum holding means for vacuum adsorbing the semiconductor substrate by vacuum suction through an adsorption hole opened to the mounting surface and holding the semiconductor substrate on the mounting surface, the semiconductor substrate being held on the mounting surface by the vacuum holding means before at least the plasma is generated.

8. The plasma treating method according to claim 7, wherein heat transfer gas feeding means for feeding a gas for heat transfer is provided in the adsorption hole, and vacuum hold of the vacuum holding means is stopped and the gas for heat transfer is fed to the adsorption hole and the gas for heat transfer is fed to the adsorption hole while at least the semiconductor substrate is electrostatically adsorbed onto the mounting surface.

9. The plasma treating method according to claim 1, further comprising cooling means for cooling the substrate mounting portion, a plasma treatment being carried out while cooling the insulating layer by the cooling means.

* * * * *